United States Patent [19]

Pesavento

[11] Patent Number: 4,860,443
[45] Date of Patent: Aug. 29, 1989

[54] METHOD FOR CONNECTING LEADLESS CHIP PACKAGE

[75] Inventor: Philip V. Pesavento, Manhattan Beach, Calif.

[73] Assignee: Hughes Aircraft Company, Los Angeles, Calif.

[21] Appl. No.: 173,018

[22] Filed: Mar. 23, 1988

Related U.S. Application Data

[63] Continuation of Ser. No. 5,715, Jan. 21, 1987, abandoned.

[51] Int. Cl.⁴ .............................................. B23P 11/02
[52] U.S. Cl. ........................................ 29/840; 29/832
[58] Field of Search ................ 29/832, 834, 835, 840; 174/52.4; 357/72; 361/403, 409; 437/209

[56] References Cited

U.S. PATENT DOCUMENTS

| | | | |
|---|---|---|---|
| 3,235,945 | 2/1966 | Hall et al. | 437/209 X |
| 3,471,753 | 10/1969 | Burks et al. | 174/68.5 X |
| 3,554,821 | 1/1971 | Caulton et al. | 29/832 X |
| 3,793,064 | 2/1974 | Budd et al. | 437/209 X |
| 3,833,838 | 9/1974 | Christiansen | 361/409 |
| 4,225,900 | 9/1980 | Ciccio et al. | 361/395 |
| 4,294,009 | 10/1981 | Quintin et al. | 29/832 |
| 4,372,037 | 2/1983 | Scapple et al. | 174/52 FP X |
| 4,423,468 | 12/1983 | Gatto et al. | 361/404 |
| 4,437,141 | 3/1984 | Prokop | 361/403 |
| 4,447,857 | 5/1984 | Marks et al. | 361/403 X |
| 4,567,643 | 2/1986 | Drouget | 357/80 X |
| 4,631,820 | 12/1986 | Harada et al. | 174/52 FP X |

FOREIGN PATENT DOCUMENTS

| | | | |
|---|---|---|---|
| 58-48442 | 3/1983 | Japan | 357/72 X |
| 1252883 | 11/1971 | United Kingdom | |

OTHER PUBLICATIONS

Fehr, Geral K., Microcircuit Packages and Assembly Techniques, Insulation/Circuits, Nov. 1971, pp. 16 to 20.

Primary Examiner—Timothy V. Eley
Attorney, Agent, or Firm—Leonard A. Alkov

[57] ABSTRACT

Leadless chip package is adhesively secured to printed wiring board and is electrically connected by metallic conductor ribbon or wire to pads on the package and pads on the printed wiring board to provide secure connected without risk of solder bridging on high density leadless chip packages.

17 Claims, 2 Drawing Sheets

METHOD FOR CONNECTING LEADLESS CHIP PACKAGE

This application is a continuation of application Ser. No. 005,715, filed Jan. 21, 1987, now abandoned.

BACKGROUND OF THE INVENTION

This invention is directed to a method for connecting leadless chip packages by employment of ultrasonic welding for attaching metallic conductors from pads on the leadless chip carrier to related pads on the associated printed wiring board.

A leadless chip carrier package is one which carries pads on the lower surface thereof. These pads are internally connected in the package to the integrated circuit chip housed and protected therein. Attachment is accomplished by placing this package onto a printed wiring board which has corresponding solder pads thereon. The leadless chip package is secured in place and electrically connected in one step by reflow soldering of the pads together by vapor-phase soldering. Such attachment is useful in many cases, but when the chip becomes electrically more complicated to result in a greater number of leads to result in a high density of pads around the lower periphery of the leadless chip package, attachment becomes more difficult. When the package is of higher density, that is with more connections than about 60 pads, the traces on the printed circuit board connecting the pads are close together so that solder bridging between traces and pads is more likely to occur because of the close spacing.

Making the leadless chip packages larger to provide more spacing between the pads accentuates other problems. In complicated electronics, the space on a printed wiring board is at a premium so that use of larger than necessary packages is wasteful of needed board space. Larger packages, whether created by more complicated electronics and greater number of required circuit connections or created by greater spacing between the pads to reduce risk of solder bridging, accentuates the problem of thermal expansion. The leadless chip packages are of a different material than the printed wiring board so that, upon temperature change, the dimensional differences produce strains in the leadless package solder pads. When these strains become excessive, cracked solder pads result. This leads to the step of building the solder pads to a higher level so that strains caused by temperature change are absorbed in the pad by resilient or ductible deflection.

It is thus seen that the conventional solder reflow attachment of leadless chip packages experiences problems when the number of pads to be connected increases so that the pads and circuit traces on the board are in a high density arrangement. Thus, there is need for a method for connecting high density packages, particularly high density leadless chip carrier packages to a corresponding printed wiring board.

SUMMARY OF THE INVENTION

In order to aid in the understanding of this invention, it can be stated in essentially summary form that it is directed to the method for connecting a leadless chip package to a supporting printed wiring board, and is directed to the leadless chip package especially adapted for that method of attachment, together with the completed assembly, wherein the method for attachment comprises mechanically attaching the leadless chip package to the associated printed wiring board and attaching a conductor to a pad on the package and the corresponding pad on the printed wiring board.

It is thus a purpose and advantage of this invention to provide a method for connecting leadless chip packages to a corresponding printed wiring board which is especially useful for high density leadless chip packages so as to permit reliable connection without the risk of cracked solder connection due to thermal expansion stresses and strains.

It is another purpose and advantage of this invention to provide a method for connecting leadless chip packages to a corresponding printed wiring board by the employment of metallic conductors which are ultrasonically welded to the pads on the chip package and corresponding pads on the printed wiring board so that attachment is accomplished without destructive temperature increase.

It is another purpose and advantage of this invention to connect high density leadless chip packages, those having greater than about 60 leads, to printed wiring boards in such a manner as to eliminate burned boards, eliminate solder plating, eliminate solder bridging to result in higher yields because of greater control of the attachment system, eliminate thermal expansion problems, and provide a method which can be made fully automatic.

Other purposes and advantages of this invention will become apparent from a study of the following portion of this specification, the claims and the attached drawings.

DESCRIPTION OF THE PREFERRED EMBODIMENTS

Figure 1:
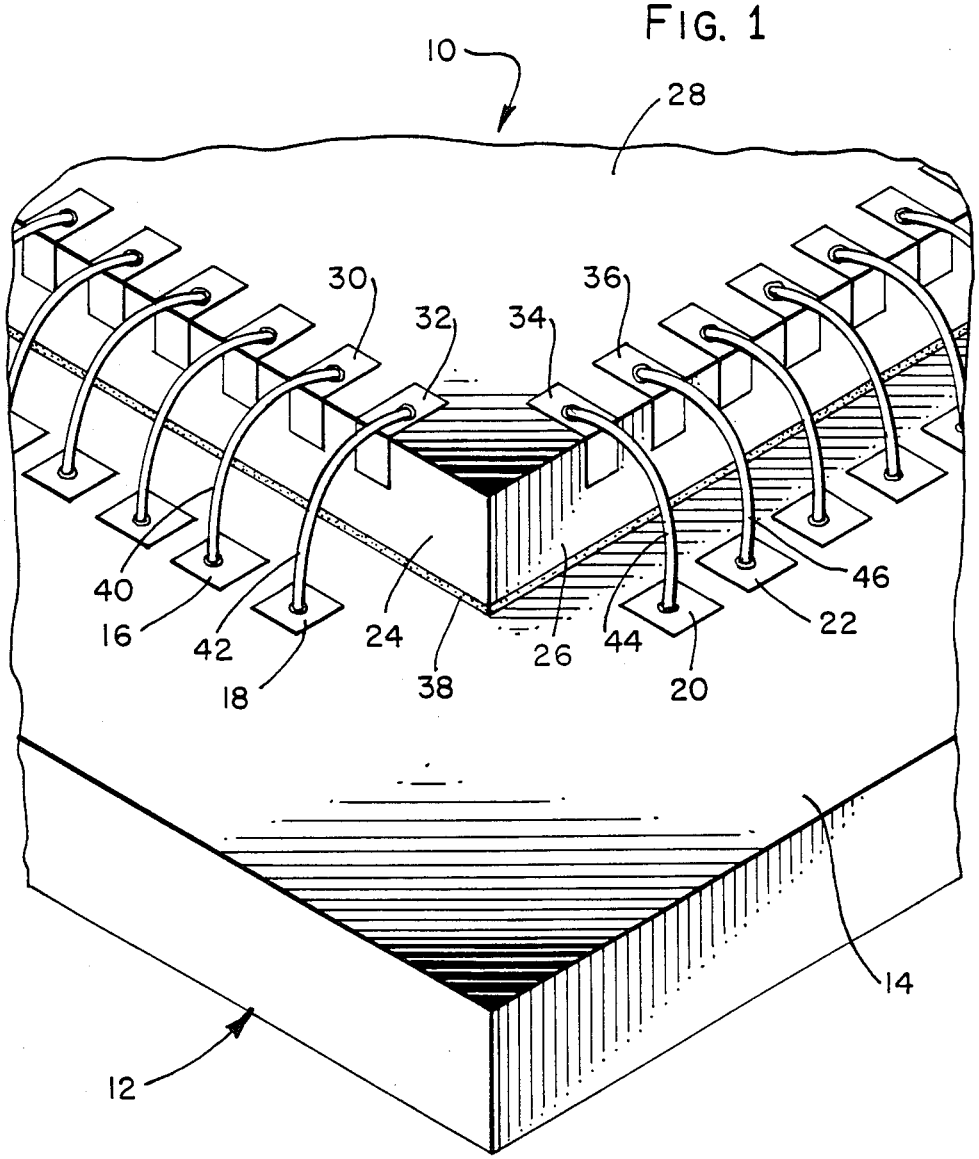
FIG. 1 is an isometric view of the corner of a printed wiring board and the corner of a leadless chip carrier package, showing the attachment in accordance with a first preferred method of this invention.

FIG. 1 illustrates a leadless chip carrier package 10 secured top surface down on the top face of printed wiring board 12. Printed wiring board 12 is of dielectric material having circuit traces formed thereon in accordance with a predetermined pattern. There are circuit traces on the top face 14, and there may be circuit traces on the bottom face and on one or more intermediate circuit trace layers. When there is more than one layer of circuit trace, the several traces are appropriately connected by vias. In the present case, the circuit traces (not shown) terminate in pads on the top face 14. Pads 16 and 18 are at the end of one string of pads, while pads 20 and 22 are at the end of another string of pads, aligned with adjacent edges 24 and 26 of package 10. Pads on the board 12 may be made of gold, copper, silver, aluminum or nickel. The most likely material is copper, and the most preferred is gold. In view of the fact that the method is particularly useful for high density packages and the resultant article has a high density of connections, the pads are expected to be on all four edges of the package, and the pads extend around the corner and onto the bottom surface 28 of package 10. Pads 30, 32, 34, and 36 are specifically identified on the package and there are similar pads usually extending around the corner to the adjacent bottom surface 28. Pads on the package 10 may be made of gold, copper, silver, aluminum or nickel. The most likely and most preferred material is gold.

The surface 28 is described as being a bottom surface because the leadless chip carrier package 10 is particularly designed so that the bottom surface 28 can face the top of a printed wiring board. In the usual use of the leadless chip carrier package 10, there are corresponding pads geometrically arranged on the top face of the printed wiring board exactly corresponding to the position of that portion of the pads which are on the bottom surface 28 of the package. Thus, in the usual usage of the package 10, each of the pads is individually connected by reflow soldering to corresponding pads on the top of the printed wiring board. However, in the present case, the package is secured, bottom surface up, in the proper position on the printed wiring board by means of adhesive 38. Electrical attachment is accomplished by conductors attached to each pad. The conductors may be formed with a rectangular, triangular, circular or oval crosssection. The most preferred shape is the circular section of round wire. Attachment can be accomplished by ultrasonic welding, thermocompression bonding, ball bonding, wedge bonding or thermalsonic bonding. All of these attachment methods can be done under 150° C. Thus, conductor 40 is attached to the pads 16 and 30. Conductor 42 is attached at its ends to pads 18 and 32. Conductor 44 is attached at its ends to pads 20 and 34, and conductor 46 is attached at its ends to pads 22 and 36. The additional conductors shown in FIG. 1 are each attached at their respective ends to the corresponding pads. As presently contemplated, the conductors may be formed with a rectangular, triangular, circular or oval cross-section. The most preferred shape is the circular section of round wire. Gold, copper, nickel and aluminum are suitable materials for the conductor, with gold being preferred. The package 10 is a ceramic package, and its pads 30 through 36 are usually gold pads. The printed wiring board 12 is preferably of polyimide filled with quartz, and the pads 16 through 22 thereon are usually copper. As previously discussed, the process is to connect large, high density leadless packages. It is most suitable for leadless packages above about 60 leads. The most preferred assembly is a round gold wire conductor attached at each end by thermalsonic ball bonding or wedge bonding. The preferred configuration of the completed assembly method comprises first attachment to the pad on the board by thermalsonic or wedge bonding and then attachment of the conductor to the appropriate pad on the package by the same attachment method, followed by parting the wire beyond the second attachment.

The process steps comprise positioning a leadless chip package on the board and adhesively securing it thereto. Thereafter, the combined structure is cleaned, and the conductors are attached at each end to corresponding pads, as described bove, without significantly (above 150° C.) elevated temperature. This eliminates the stress to provide reliable bonds.

Figure 2:
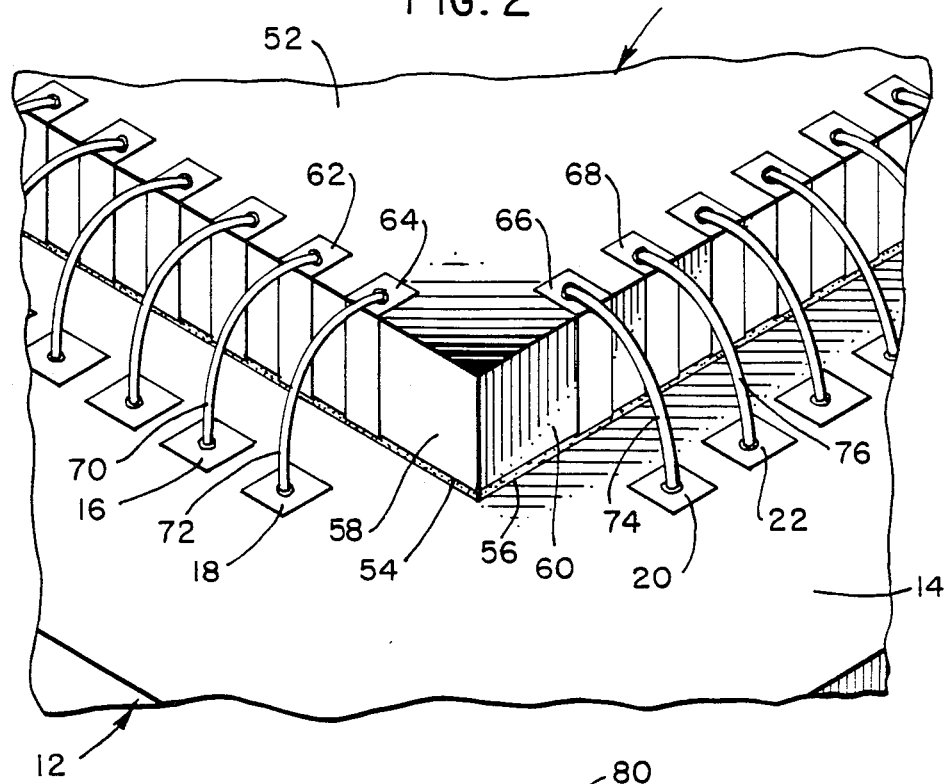
FIG. 2 is a similar view showing the connection by means of the second preferred method.

In FIG. 1, the package 10 is a standard leadless chip carrier package and is inverted. In FIG. 2, leadless chip carrier package 50 is shown as mounted upon the same printed wiring board 12, alternatively to the package 10. The package 50 is also a leadless chip carrier package, made of ceramic, and with pads on the exterior thereof for mating with corresponding pads on the top of an appropriate printed wiring board. In the present case, the top face 52 of the package is away from printed wiring board 12, and bottom 54 is adhesively secured to the top surface 14 of printing wiring board 12 by means of adhesive 56. In order to make the pads on the package 50 accessible for bonding, the pads on package 50, which normally extend a short distance across the bottom 54 and partway up the edges 58 and 60, are extended during the manufacture of the package to also extend partway across the top face 52 to provide pads also on the top face. Thus, the package 50 could be connected at its bottom pads by conventional reflow soldering onto corresponding pads of the printed wiring board. However, the pads also extend to the top where pads 62, 64, 66, and 68 are indicated. Thus, the package 50 is special in that it has the same pads extending across the bottom face adjacent an edge, along the edge and across the top face adjacent the edge to define these pads. In this way, the package 50 may be employed with a standard reflow soldering type of attachment and also can be attached by the method in accordance with this invention. The method comprises attaching connector leads such as described above to corresponding pads by means of the attachment methods described above. Conductors 72, 74, and 76 are specifically indicated in FIG. 2. There are additional pads on both the package and the printed wiring board, and there are additional conductors interconnecting appropriate pads. Conductor 70 is shown interconnecting pads 16 and 62; conductor 72 is shown interconnecting pads 18 and 64; conductor 74 is shown interconnecting pads 20 and 66; while conductor 76 is shown interconnecting pads 22 and 68. The material of pads 62 through 68 and the material and shape of conductors 70 through 76 are as described above.

Figure 3:
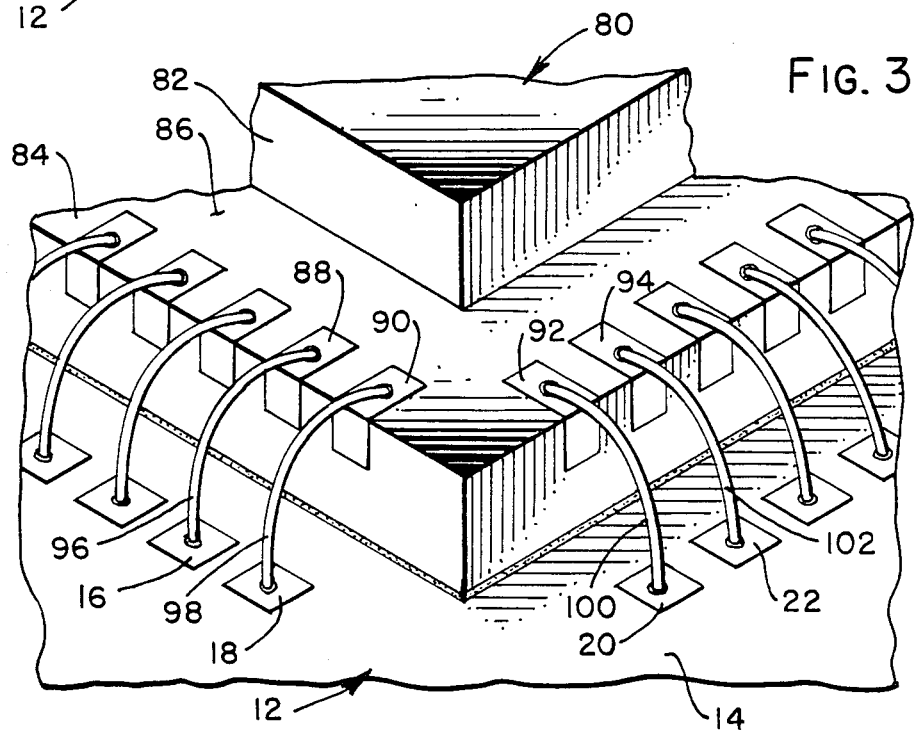
FIG. 3 is a similar view showing connection by a third preferred method.

FIG. 3 shows the attachment of leadless chip carrier package 80 to the printed wiring board 12. In this case, the same printed wiring board is used with appropriate circuit traces and appropriately positioned connection pads. The package 80 is especially configured for utilization in accordance with the method of this invention. Leadless chip carrier packages are normally made up of layers of ceramic material which are appropriately furnished with circuit traces and pads as well as physical configuration. The layers are stacked and then fired into a unitary structure. In the case of package 80, the upper layer 82 is smaller than the lower layer 84 to define a shelf 86 upon which pads are provided. These pads are internally connected to the chip in the package. Pads 88, 90, 92 and 94 are provided on this shelf adjacent the outer edge thereof so as to make them accessible for bonding. There are additional pads, as shown, and they preferably extend around all four edges of the package 80. Since the method in accordance with this invention is especially useful for packages above 60 leads, only a few of such leads are shown and identified. Attachment of the package 80 to the board 12 is by adhesive, as previously described, and interconnection between the pads on the package and the pads on the board is as described above. Conductors 96, 98, 100 and 102 are specifically identified. These conductors respectively interconnect pads 16 and 88, pads 18 and 90, pads 20 and 92, and pads 22 and 94. The conductors are as previously described, as is the material of the package, printed wiring board and various pads. The attachment in accordance with this method eliminates burned boards, solder plating, solder bridging, and provides higher yields because of greater parameter control and elimination of thermal expansion problems.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. The method for mounting and connecting a hermetically sealed leadless chip package with connection pads selected from the group consisting of gold and gold-plated copper on the top face thereof on a printed wiring board, comprising the steps of:
   positioning the hermetically sealed leadless chip package on the printed circuit board and attaching it thereto adjacent pads selected from the group consisting of gold and gold-plated copper on the exposed top face of the printed wiring board and orienting the leadless chip package so that the pads on the top face thereof are directed in the same direction as the pads on the exposed top face of the printed wiring board;
   selecting a conductor from the group consisting of gold and gold-plated copper; and
   attaching the electrical conductor to an upwardly facing pad on the chip carrier and to an adacent upwardly facing pad on the printed wiring board by means of an attachment step selected from the group of attachment steps consisting of:
   ultrasonic welding, thermocompression bonding, ball bonding, wedge bonding and thermalsonic bonding.

2. The method of claim 1 including the step of:
   selecting the printed wiring board to be a fiber reinforced thermosetting adhesive printed wiring board, prior to the attachment step.

3. The method of claim 2 including the step of:
   selecting the conductor from the group consisting of conductors having a cross-section which is round, rectangular, triangular and oval.

4. The method of claim 1 including the step of:
   selecting the conductor from the group consisting of conductors having a cross-section which is round, rectangular, triangular and oval.

5. The method of claim 1 including the step of:
   securing the chip carrier package to the top face of the printed wiring board by adhesive attachment.

6. The method of claim 5 wherein the step of securing the hermetically sealed leadless chip carrier package to the top face of the printed wiring board is by adhesive securement.

7. The method of claim 5 wherein the step of securing the chip carrier package to the top face of the printed wiring board is by adhesive securement.

8. The article produced by the method of claim 7.

9. The method of claim 1 including a step of cleaning the printed wiring board and the leadless chip package is performed before the step of electrically interconnecting the pads by attachment of conductors therebetween.

10. The method of claim 1 including the step of:
    extending pads from the bottom to the top of the hermetically sealed leadless chip package and the extending step is performed before the positioning step so that there are pads on the hermetically sealed leadless chip carrier package facing both the top face of the printed wiring board and facing in the same direction as pads on the printed wiring board.

11. The article produced by the method of claim 1.

12. The method of connecting a hermetically sealed leadless chip package on a printed wiring board comprising the steps of:
    printing wiring on a fiber reinforced thermosetting synthetic material board with conductive connection pads on a top face thereof;
    forming a hermetically sealed leadless chip package so that the chip package has conductive connection pads on a top surface thereof positioned adjacent to an edge of a surface opposite a bottom surface thereof;
    positioning the hermetically sealed leadless chip package with its bottom surface on the top face of the printed wiring board so that the connection pads on the hermetically sealed leadless chip package face in the same direction as the connection pads on the printed wiring board;
    adhesively securing the hermetically sealed leadless chip package in place with its bottom surface on the top face of the printed wiring board;
    bonding a metallic conductor to a connection pad on the hermetically sealed leadless chip package and bonding the same metallic conductor to a corresponding connection pad on the printed wiring board; and
    repeating the bonding steps for a plurality of connection pads on the hermetically sealed leadless chip package so that the circuitry of the hermetically sealed leadless chip package is connected to the connection pads on the printed wiring board.

13. The method of claim 12 wherein the bonding step is selected from the group of bonding steps consisting of:
    ultrasonic welding, thermocompression bonding, ball bonding wedge bonding and thermalsonic bonding.

14. The method of claim 12 wherein the bonding of an electrical conductor is performed with a metallic wire selected from the group consisting of gold and gold plated copper.

15. The method of claim 12 wherein the step of forming the pads on the hermetically sealed leadless chip package includes the step of forming the pads so that they are present on both the top and bottom surfaces of the hermetically sealed leadless chip package.

16. The article produced by the method of claim 15.

17. The article produced by the method of claim 12.

* * * * *